(12) United States Patent
Cheng et al.

(10) Patent No.: US 12,068,173 B2
(45) Date of Patent: *Aug. 20, 2024

(54) PACKAGE STRUCTURE AND MANUFACTURING METHOD THEREOF

(71) Applicant: Taiwan Semiconductor Manufacturing Company, Ltd., Hsinchu (TW)

(72) Inventors: Li-Hui Cheng, New Taipei (TW); Szu-Wei Lu, Hsinchu (TW); Ping-Yin Hsieh, Hsinchu (TW); Chih-Hao Chen, Hsinchu (TW)

(73) Assignee: Taiwan Semiconductor Manufacturing Company, Ltd., Hsinchu (TW)

( * ) Notice: Subject to any disclaimer, the term of this patent is extended or adjusted under 35 U.S.C. 154(b) by 0 days.

This patent is subject to a terminal disclaimer.

(21) Appl. No.: 18/321,686

(22) Filed: May 22, 2023

(65) Prior Publication Data

US 2023/0290650 A1 Sep. 14, 2023

Related U.S. Application Data

(60) Continuation of application No. 17/389,193, filed on Jul. 29, 2021, now Pat. No. 11,699,597, which is a
(Continued)

(51) Int. Cl.
| | |
|---|---|
| *H01L 23/48* | (2006.01) |
| *H01L 21/48* | (2006.01) |
| *H01L 21/56* | (2006.01) |
| *H01L 23/00* | (2006.01) |
| *H01L 25/10* | (2006.01) |

(52) U.S. Cl.
CPC .......... *H01L 21/486* (2013.01); *H01L 21/561* (2013.01); *H01L 24/24* (2013.01); *H01L 24/25* (2013.01); *H01L 24/96* (2013.01); *H01L 25/105* (2013.01); *H01L 2224/24175* (2013.01); *H01L 2224/25171* (2013.01);
(Continued)

(58) Field of Classification Search
CPC ..... H01L 21/486; H01L 21/56; H01L 21/561; H01L 2225/1035; H01L 2225/1058; H01L 2924/181
USPC ........................................................ 257/774
See application file for complete search history.

(56) References Cited

U.S. PATENT DOCUMENTS

| | | |
|---|---|---|
| 9,000,584 B2 | 4/2015 | Lin et al. |
| 9,048,222 B2 | 6/2015 | Hung et al. |
| (Continued) | | |

*Primary Examiner* — Nitin Parekh
(74) *Attorney, Agent, or Firm* — JCIPRNET

(57) ABSTRACT

A package structure and the manufacturing method thereof are provided. The package structure includes a semiconductor die, conductive through vias, an insulating encapsulant, and a redistribution structure. The conductive through vias are electrically coupled to the semiconductor die. The insulating encapsulant laterally encapsulates the semiconductor die and the conductive through vias, wherein the insulating encapsulant has a recess ring surrounding the semiconductor die, the conductive through vias are located under the recess ring, and a vertical projection of each of the conductive through vias overlaps with a vertical projection of the recess ring. The redistribution structure is electrically connected to the semiconductor die and the conductive through vias.

20 Claims, 19 Drawing Sheets

Related U.S. Application Data division of application No. 16/283,851, filed on Feb. 25, 2019, now Pat. No. 11,081,369.

(52) U.S. Cl.
CPC .......... *H01L 2225/1035* (2013.01); *H01L 2225/1041* (2013.01); *H01L 2225/1058* (2013.01)

(56) References Cited

U.S. PATENT DOCUMENTS

| | | |
|---|---|---|
| 9,048,233 B2 | 6/2015 | Wu et al. |
| 9,064,879 B2 | 6/2015 | Hung et al. |
| 9,111,949 B2 | 8/2015 | Yu et al. |
| 9,263,511 B2 | 2/2016 | Yu et al. |
| 9,281,254 B2 | 3/2016 | Yu et al. |
| 9,368,460 B2 | 6/2016 | Yu et al. |
| 9,372,206 B2 | 6/2016 | Wu et al. |
| 9,496,189 B2 | 11/2016 | Yu et al. |
| 2015/0206815 A1* | 7/2015 | Katkar ................ H01L 23/3107 257/738 |
| 2016/0148857 A1* | 5/2016 | Lin ........................ H01L 24/92 257/762 |
| 2016/0218049 A1* | 7/2016 | Lin ........................ H01L 24/97 |
| 2016/0307778 A1* | 10/2016 | Lin ..................... H01L 21/6836 |
| 2017/0092604 A1* | 3/2017 | Hsieh ..................... H01L 24/11 |
| 2017/0221830 A1* | 8/2017 | Scanlan ............ H01L 21/76838 |
| 2018/0269188 A1* | 9/2018 | Yu ....................... H01L 23/3128 |
| 2018/0330966 A1* | 11/2018 | Scanlan ................. H01L 24/19 |

* cited by examiner

PACKAGE STRUCTURE AND MANUFACTURING METHOD THEREOF

CROSS-REFERENCE TO RELATED APPLICATION

This application is a continuation application of and claims the priority benefit of U.S. application Ser. No. 17/389,193, filed on Jul. 29, 2021, now allowed, which is a divisional application of and claims the priority benefit of U.S. application Ser. No. 16/283,851, filed on Feb. 25, 2019, now issued as U.S. Pat. No. 11,081,369. The entirety of each of the above-mentioned patent applications is hereby incorporated by reference herein and made a part of this specification.

BACKGROUND

Semiconductor devices are used in a variety of electronic applications, such as personal computers, cell phones, digital cameras, and other electronic devices. As the demand for shrinking electronic devices has grown, a need for smaller and more creative packaging techniques of semiconductor dies has emerged. Thus, packages such as wafer level packaging (WLP) have begun to be developed, in which integrated circuits (ICs) are placed on a carrier having connectors for making connection to the ICs and other electrical components. In an attempt to further increase circuit density, some package-on-package (POP) structures including an integrated fan-out package and at least one memory device stacked over the integrated fan-out package are developed and are becoming increasingly popular for their compactness. As the demand for miniaturization, higher speed and greater bandwidth, as well as lower power consumption and latency has grown recently, there has grown a need for smaller and more creative packaging techniques of POP structures.

BRIEF DESCRIPTION OF THE DRAWINGS

Aspects of the disclosure are best understood from the following detailed description when read with the accompanying figures. It is noted that, in accordance with the standard practice in the industry, various features are not drawn to scale. In fact, the dimensions of the various features may be arbitrarily increased or reduced for clarity of discussion.

DETAILED DESCRIPTION

Figure 1A:
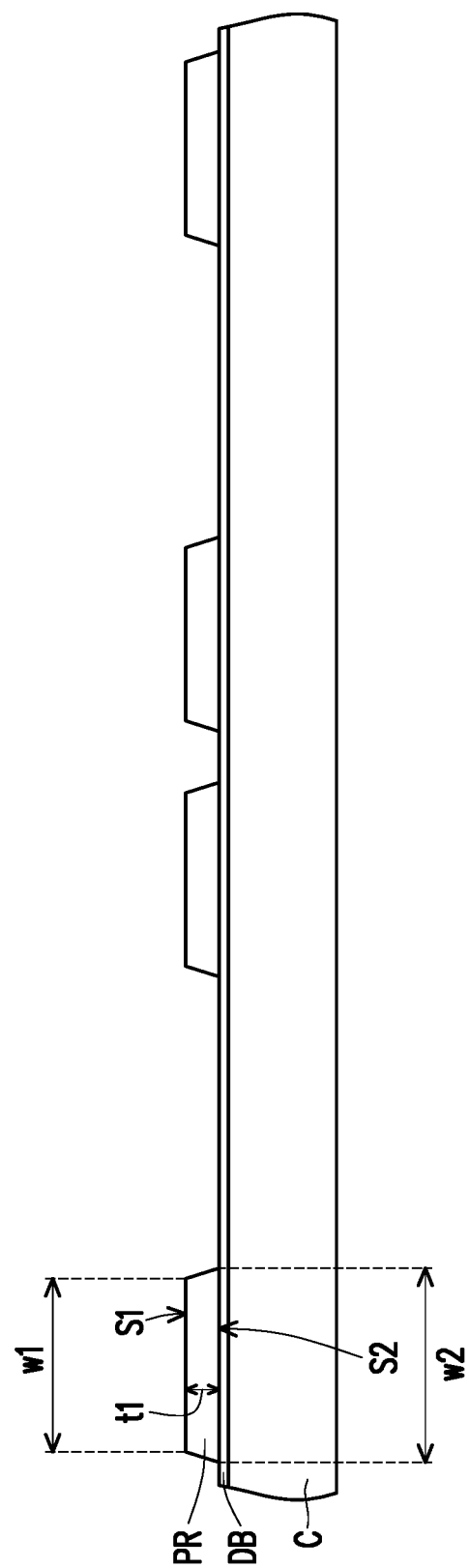
FIG. 1A to FIG. 1O are schematic cross-sectional views illustrating process steps of manufacturing a package structure in accordance with some embodiments.

The following disclosure provides many different embodiments, or examples, for implementing different features of the provided subject matter. Specific examples of components, values, operations, materials, arrangements, or the like, are described below to simplify the disclosure. These are, of course, merely examples and are not intended to be limiting. Other components, values, operations, materials, arrangements, or the like, are contemplated. For example, the formation of a first feature over or on a second feature in the description that follows may include embodiments in which the first and second features are formed in direct contact, and may also include embodiments in which additional features may be formed between the first and second features, such that the first and second features may not be in direct contact. In addition, the disclosure may repeat reference numerals and/or letters in the various examples. This repetition is for the purpose of simplicity and clarity and does not in itself dictate a relationship between the various embodiments and/or configurations discussed.

Further, spatially relative terms, such as "beneath," "below," "lower," "above," "upper" and the like, may be used herein for ease of description to describe one element or feature's relationship to another element(s) or feature(s) as illustrated in the figures. The spatially relative terms are intended to encompass different orientations of the device in use or operation in addition to the orientation depicted in the figures. The apparatus may be otherwise oriented (rotated 90 degrees or at other orientations) and the spatially relative descriptors used herein may likewise be interpreted accordingly.

In addition, terms, such as "first," "second," and the like, may be used herein for ease of description to describe similar or different element(s) or feature(s) as illustrated in the figures, and may be used interchangeably depending on the order of the presence or the contexts of the description.

Other features and processes may also be included. For example, testing structures may be included to aid in the verification testing of the 3D packaging or 3DIC devices. The testing structures may include, for example, test pads formed in a redistribution layer or on a substrate that allows the testing of the 3D packaging or 3DIC, the use of probes and/or probe cards, and the like. The verification testing may be performed on intermediate structures as well as the final structure. Additionally, the structures and methods disclosed herein may be used in conjunction with testing methodologies that incorporate intermediate verification of known good dies to increase the yield and decrease costs.

FIG. 1A to FIG. 1O are schematic cross-sectional views illustrating process steps of manufacturing a package structure in accordance with some embodiments. FIG. 2 is a schematic top view illustrating the package structure at the step of FIG. 1I. The schematic cross-sectional views illustrated in FIG. 1A to FIG. 1I are taken along the cross-section line A-A' as shown in FIG. 2. Illustration of the insulating encapsulant on the carrier C is omitted in FIG. 2.

Referring to FIG. 1A, a carrier C having a de-bonding layer DB formed thereon is provided. In some embodiments, the carrier C is a glass substrate, the de-bonding layer DB includes a light-to-heat conversion (LTHC) release layer formed on the glass substrate. In some alternative embodiments, the de-bonding layer DB may be made of glue or polymer-based materials. However, the materials of the carrier C and the de-bonding layer DB listed above are merely for exemplary illustration, and the disclosure is not limited thereto. In some alternative embodiments, other materials may be adapted as the carrier C as long as the said material is able to withstand the subsequent process while carrying/supporting the subsequently formed elements. Similarly, other materials may be adapted as the de-bonding layer DB as long as the material is able to perform the release function in the subsequent processes. In some alternative embodiments, a dielectric layer (not shown) may be formed on the de-bonding layer DB such that the de-bonding layer DB is between the carrier C and the dielectric layer. In some embodiments, the dielectric layer includes a buffer layer and the material of the buffer layer includes polyimide (PI), polybenzoxazole (PBO), benzocyclobutene (BCB), or any other suitable polymer-based dielectric material. In some embodiments, the buffer layer may be an Ajinomoto Buildup Film (ABF), a solder resist film, or the like.

Still referring to FIG. 1A, after the de-bonding layer DB is formed on the carrier C, polymer ring patterns PR are formed on the de-bonding layer DB. In some embodiments, the formation of the polymer ring patterns PR includes forming polymer material patterns (not shown) on the de-bonding layer DB, then performing a baking process or a curing process on the polymer material patterns. The polymer material patterns may be formed by performing a printing process. In certain embodiment, the printing process may be a screen printing, an inkjet printing, a three-dimensional printing, or the like. The baking process or the curing process may be performed by irradiating the polymer material patterns with an UV laser. In some embodiments, the material of the polymer ring patterns PR includes epoxy resin, acrylic resin, or any other suitable polymer-based dielectric material.

Referring to FIG. 1A and FIG. 2, from the top view, the shape of each of the polymer ring patterns PR may be a quadrilateral ring shape. However, the disclosure is not limited thereto. In some alternative embodiments, the shape of each of the polymer ring patterns PR may be a circle, any other suitable polygon, or any other suitable shape from a top plan view. In some embodiments, each of the polymer ring patterns PR has a top surface S1 and a bottom surface S2 opposite to the top surface S1. In some embodiments, from the cross-sectional view as shown in FIG. 1A, the width w1 of the top surface S1 is less than the width w2 of the bottom surface S2. Besides, as illustrated in FIG. 1A and FIG. 2, each of the polymer ring patterns PR is shaped in a closed loop with trapezoid-shaped cross sections. In some embodiments, the width w1 of the top surface 51 may range from about 100 micrometers to about 3000 micrometers, and the width w2 of the bottom surface S2 may range from about 100 micrometers to about 3000 micrometers. In some embodiments, the thickness t1 of each of the polymer ring patterns PR may range from about 5 micrometers to about 100 micrometers. In some embodiments, from the cross-sectional view as shown in FIG. 1A, the top surface S1 is an even surface, but the disclosure is not limited thereto. In some alternative embodiments, from the cross-sectional view, the top surface S1 is a rough surface or an uneven surface, and the roughness of the top surface S1 may range from about 1 micrometer to about 30 micrometers. In some embodiments, from the cross-sectional view as shown in FIG. 1A, the edge profile of each of the polymer ring patterns PR is sharp, but the disclosure is not limited thereto. In some alternative embodiments, from the cross-sectional view, the edge profile of each of the polymer ring patterns PR is smooth.

Figure 1B:
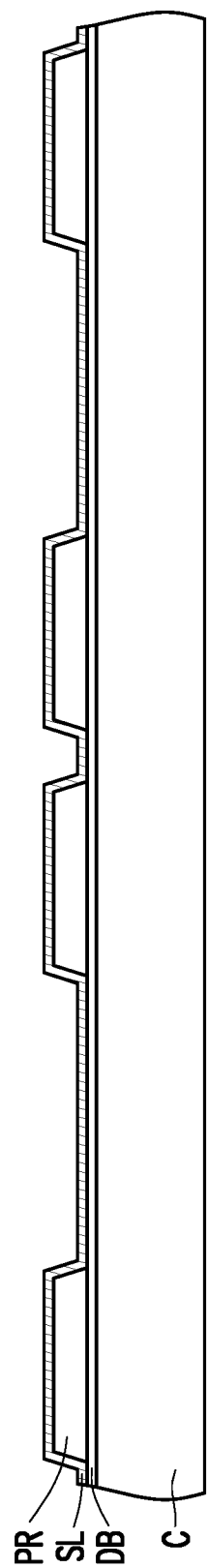
Figure 2:
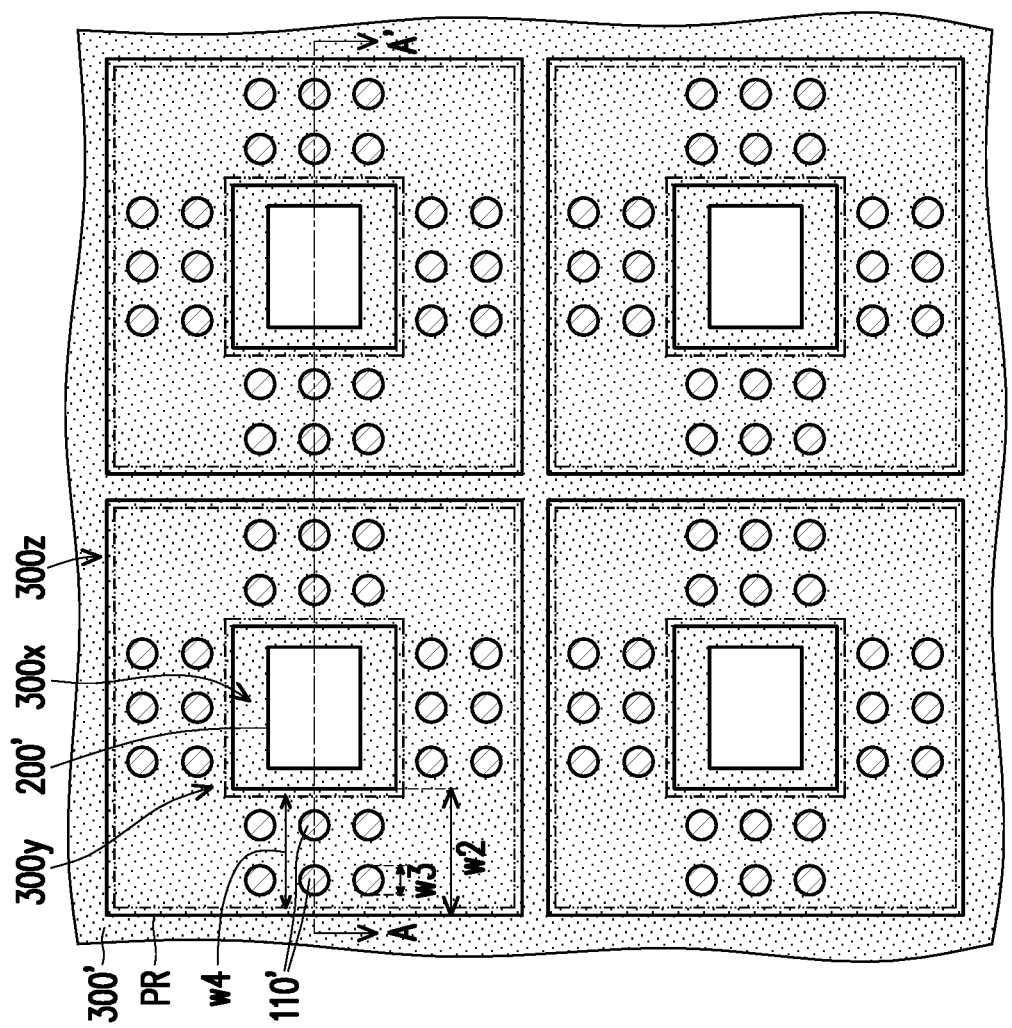
FIG. 2 is a schematic top view illustrating the package structure at the step of FIG. 1I.

Referring to FIG. 1B, a seed material layer SL is formed on the de-bonding layer DB and covers the polymer ring patterns PR. In some embodiments, the seed material layer SL may be a single layer. In some embodiments, the seed material layer SL may be a composite layer formed by different materials. In some embodiments, the material of the seed material layer SL may include copper, copper alloys, titanium, titanium nitride, tantalum, tantalum nitride, a combination thereof, or other suitable materials. In some embodiments, the seed material layer SL is formed by physical vapor deposition or other applicable methods. In some embodiments, the thickness of the seed material layer SL may range from about 0.01 micrometers to about 1 micrometer.

Figure 1C:
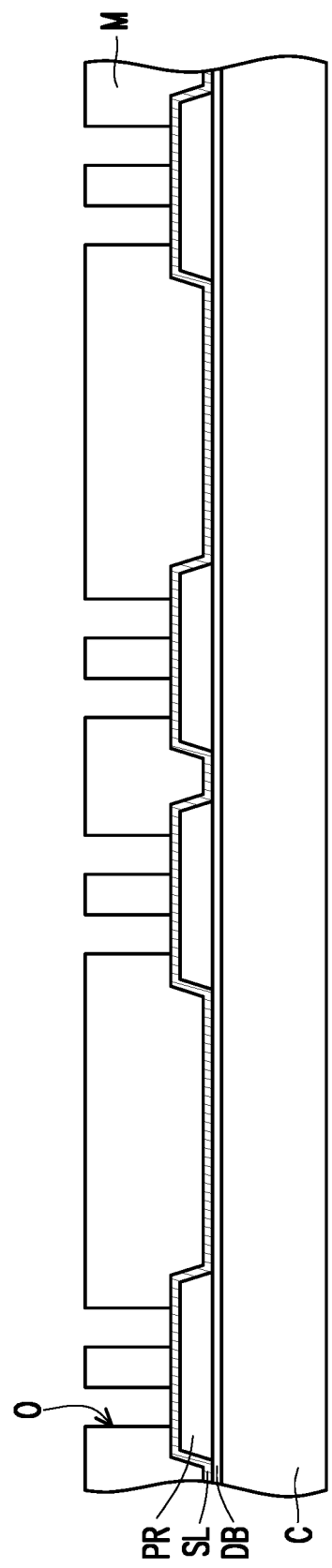

Referring to FIG. 1C, a mask M is formed over the seed material layer SL. The mask M is patterned to render openings O, wherein a vertical projection of each of the openings O overlaps with a vertical projection of each of the polymer ring patterns PR. In some embodiments, the openings O expose the intended locations for the subsequently formed conductive through vias 110 (shown in FIG. 1F). In some embodiments, the openings O of the mask M expose a portion of the seed material layer SL. In some embodiments, the mask M may be formed by a photosensitive material. For example, the mask M may be a photoresist or a dry film. In some embodiments, the openings O are formed through a photolithography process.

Figure 1D:
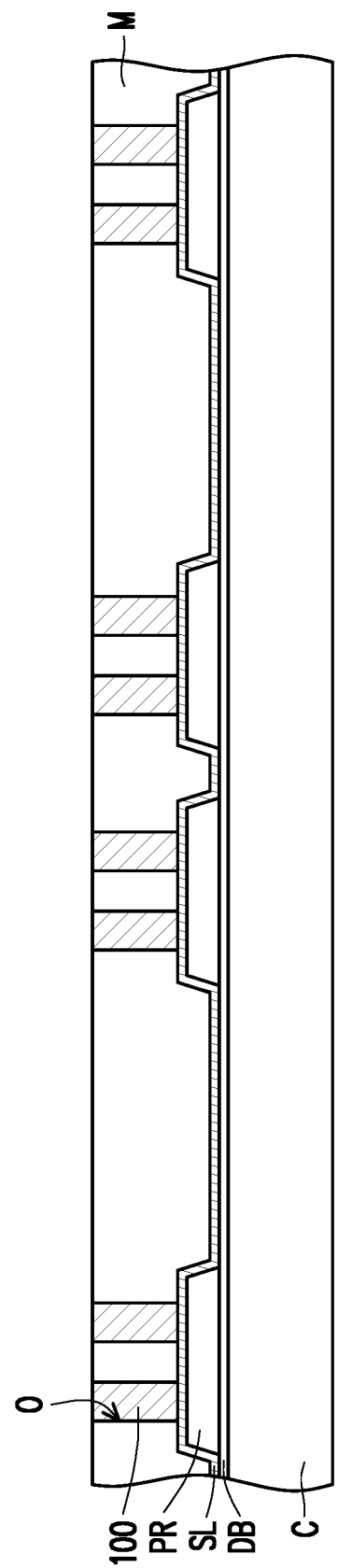

Referring to FIG. 1D, a conductive material 100 is formed on the seed material layer SL and in the openings O of the mask M. In some embodiments, the conductive material 100 is formed on the portion of the seed material layer SL exposed by the openings O of the mask M. In some embodiments, the conductive material 100 may be formed by a plating process. The plating process is, for example, electro-plating, electroless-plating, immersion plating, or the like. The conductive material 100 is, for example, copper, copper alloys, or the like. In other words, the seed material layer SL and the conductive material 100 may be made of the same material or different materials.

Figure 1E:
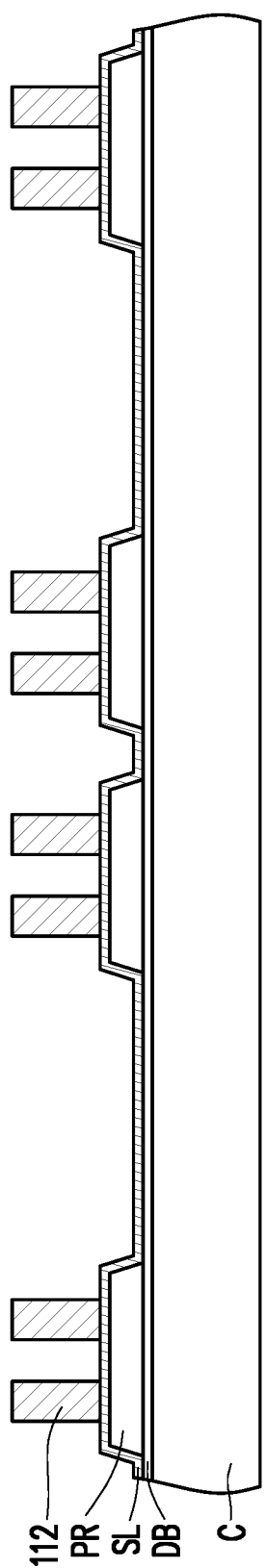

Referring to FIG. 1D and FIG. 1E, the mask M is subsequently removed to obtain conductive patterns 112 on top of the seed material layer SL. In some embodiments, the mask M may be removed through a stripping process, an etching process, and/or a cleaning process. Since the conductive patterns 112 are formed by filling the conductive material 100 into the openings O of the mask M and removing the mask M, the conductive patterns 112 may have the same contour as the openings O of the mask M.

Figure 1F:
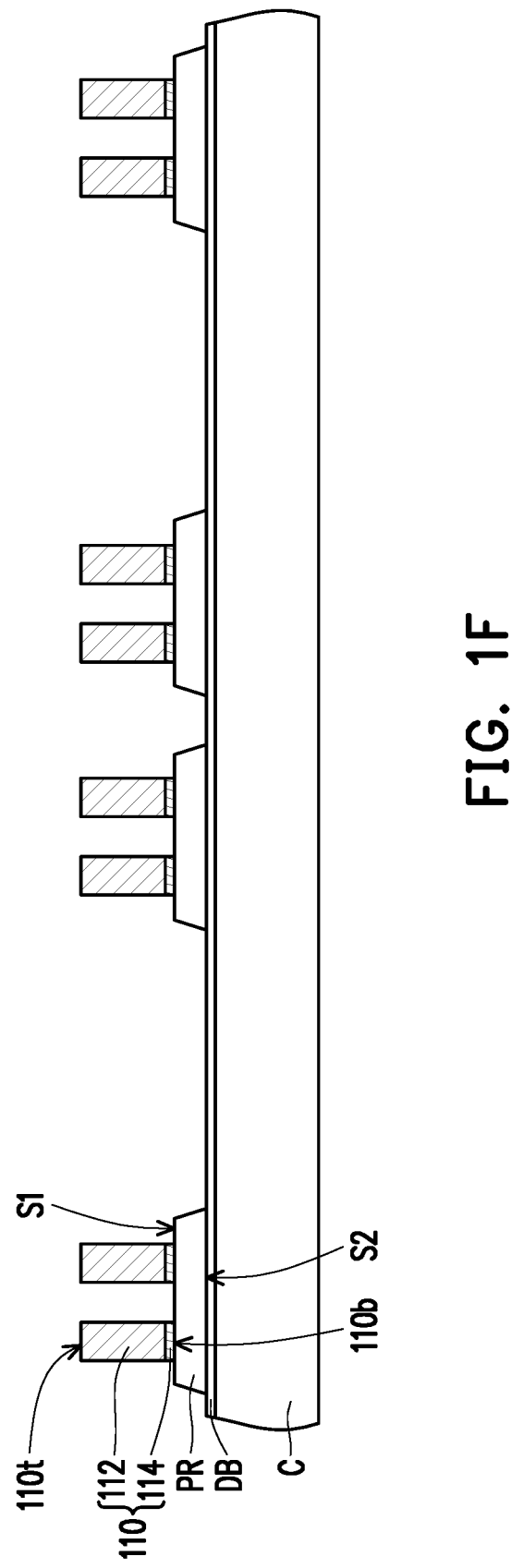

Referring to FIG. 1E and FIG. 1F, portions of the seed material layer SL exposed by the conductive patterns 112 are removed to form seed layer patterns 114 underneath the conductive patterns 112. In some embodiments, the portions of the seed material layer SL may be removed through a dry etching process or a wet etching process. In some embodiments, the conductive patterns 112 and the seed layer patterns 114 are collectively referred to as the conductive through vias 110. In other words, as illustrated in FIG. 1F, the conductive through vias 110 are formed on the polymer ring patterns PR. In some embodiments, each of the conductive through vias 110 has a top surface 110t and a bottom surface 110b opposite to the top surface 110t. In some embodiments, the seed layer patterns 114 located on the bottom surfaces 110b of the conductive through vias 110 are directly in contact with the top surfaces S1 of the polymer ring patterns PR. For example, the seed layer patterns 114 are directly in contact with the polymer ring patterns PR such that in each of the conductive through vias 110, the seed layer pattern 114 is sandwiched between the conductive pattern 112 and the corresponding polymer ring pattern PR. As illustrated in FIG. 1F, each of the conductive through vias 110 includes the conductive pattern 112 and the seed layer pattern 114, but the disclosure is not limited thereto. In some alternative embodiments, each of the conductive through vias 110 does not include the seed layer pattern 114, and at this time the conductive through vias 110 are formed through a pick-and-place process or a wire bonding process on the polymer ring patterns PR.

Figure 1G:
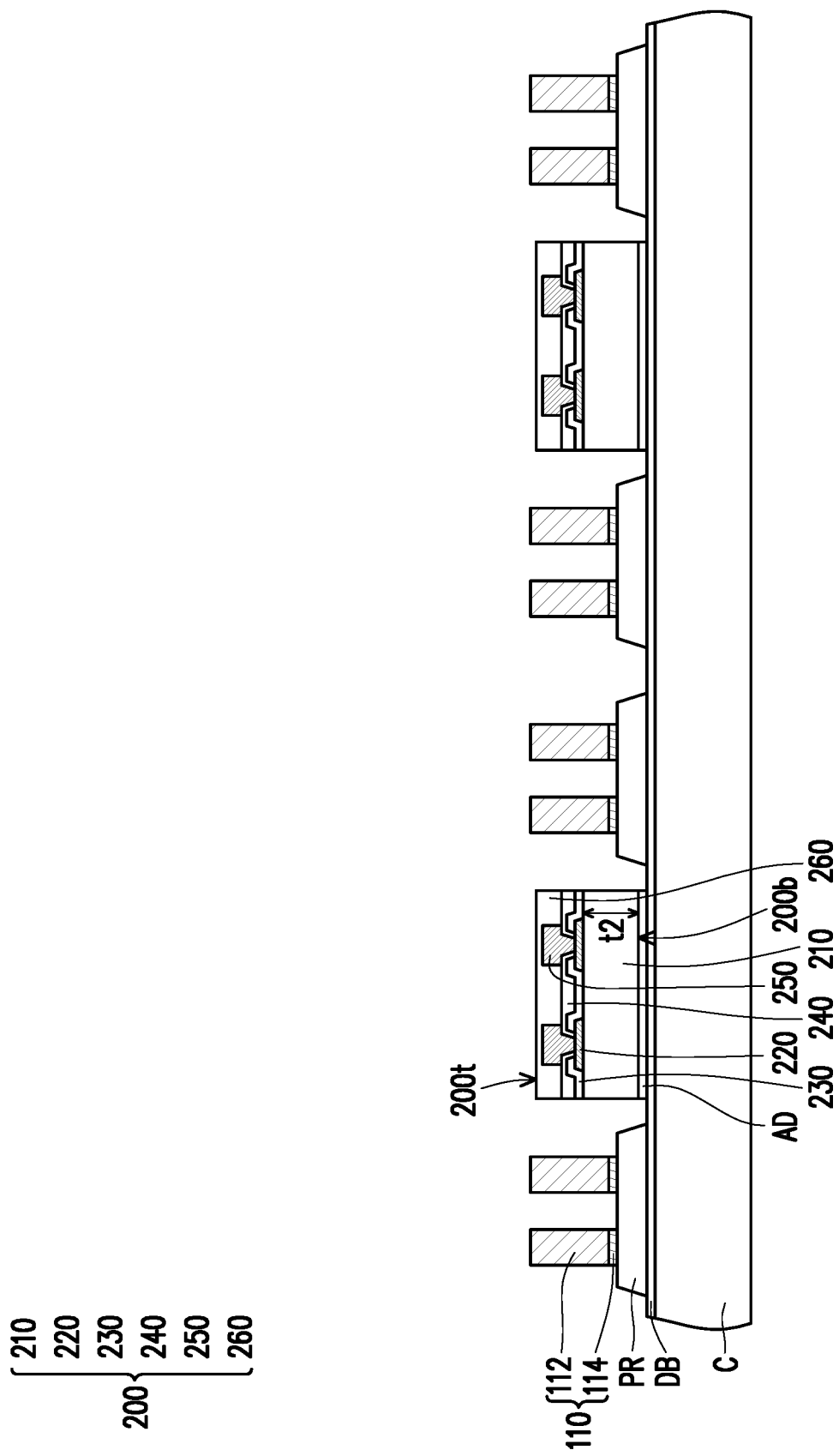

Referring to FIG. 1G, after the conductive through vias 110 are formed, semiconductor dies 200 are placed on the de-bonding layer DB. In some embodiments, the semiconductor dies 200 are positioned beside the polymer ring patterns PR and between the conductive through vias 110. Referring to FIG. 1G and FIG. 2, from the top view, the semiconductor dies 200 are arranged in an array and are surrounded by the polymer ring patterns PR. In some embodiments, each semiconductor die 200 has a top surface 200t and a bottom surface 200b opposite to the top surface 200t. As illustrated in FIG. 1G, the semiconductor dies 200 are placed such that the top surfaces 200t face upward while the bottom surfaces 200b face the de-bonding layer DB. In some embodiments, the semiconductor dies 200 are placed over the de-bonding layer DB through a pick-and-place process. In some embodiments, each semiconductor die 200 may be a memory die (i.e. DRAM, SRAM, NVRAM, and/or the like), a logic die, a radio frequency (RF) die, or a processor die (i.e. accelerated processor (AP)). The configuration of each semiconductor die 200 will be described below.

In some embodiments, each of the semiconductor dies 200 may include a semiconductor substrate 210, conductive pads 220 formed on the semiconductor substrate 210, a passivation layer 230 and a post-passivation layer 240 formed covering the conductive pads 220, conductive pillars 250 formed on the conductive pads 220, and a protection layer 260 formed on the post passivation layer 240 so as to cover the conductive pillars 250. For example, the semiconductor substrate 210 may be a silicon substrate including active components (e.g., transistors or the like) and passive components (e.g., resistors, capacitors, inductors or the like) formed therein and an interconnection structure formed on the silicon substrate. In some embodiments, the thickness t2 of the semiconductor substrate 210 of each of the semiconductor dies 200 may range from about 30 micrometers to about 550 micrometers. In some embodiments, the thickness t2 of the semiconductor substrate 210 of each of the semiconductor dies 200 may range from about 50 micrometers to about 550 micrometers, thereby even the adhesive layer AD (described hereinafter) having poor thermal conductivity which would lead to accumulation of heat generated during the operation of the semiconductor dies 200' (shown in FIG. 1I and described hereinafter) within the subsequently formed semiconductor package 60 (shown in FIG. 1O and described hereinafter) is disposed, the heat dissipation performance of the semiconductor package 60 is enhanced.

The conductive pads 220 may be aluminum pads, copper pads or other suitable metal pads. The passivation layer 230 may be a silicon oxide layer, a silicon nitride layer, a silicon oxy-nitride layer or a dielectric layer formed by other suitable dielectric materials, while the post passivation layer 240 may be a polyimide (PI) layer, a polybenzoxazole (PBO) layer, or a dielectric layer formed by other suitable polymers, for example. The passivation layer 230 and the post passivation layer 240 may be regarded as a composite passivation layer. Alternatively, the composite passivation layer may be replaced by a single passivation layer. The conductive pillars 250 may be copper pillars or other suitable metal pillars, and the protection layer 260 may be a PBO layer, a polyimide layer or other suitable polymeric material layer.

In some embodiments, the bottom surfaces 200b of the semiconductor dies 200 are adhered to the de-bonding layer DB through an adhesive layer AD. In some embodiments, the adhesive layer AD may include a die attach film (DAF). However, the disclosure is not limited thereto. In some alternative embodiments, other materials may be adapted as the adhesive layer AD as long as the said material is able to strengthen the adhesion between the semiconductor dies 200 and the de-bonding layer DB.

Figure 1H:
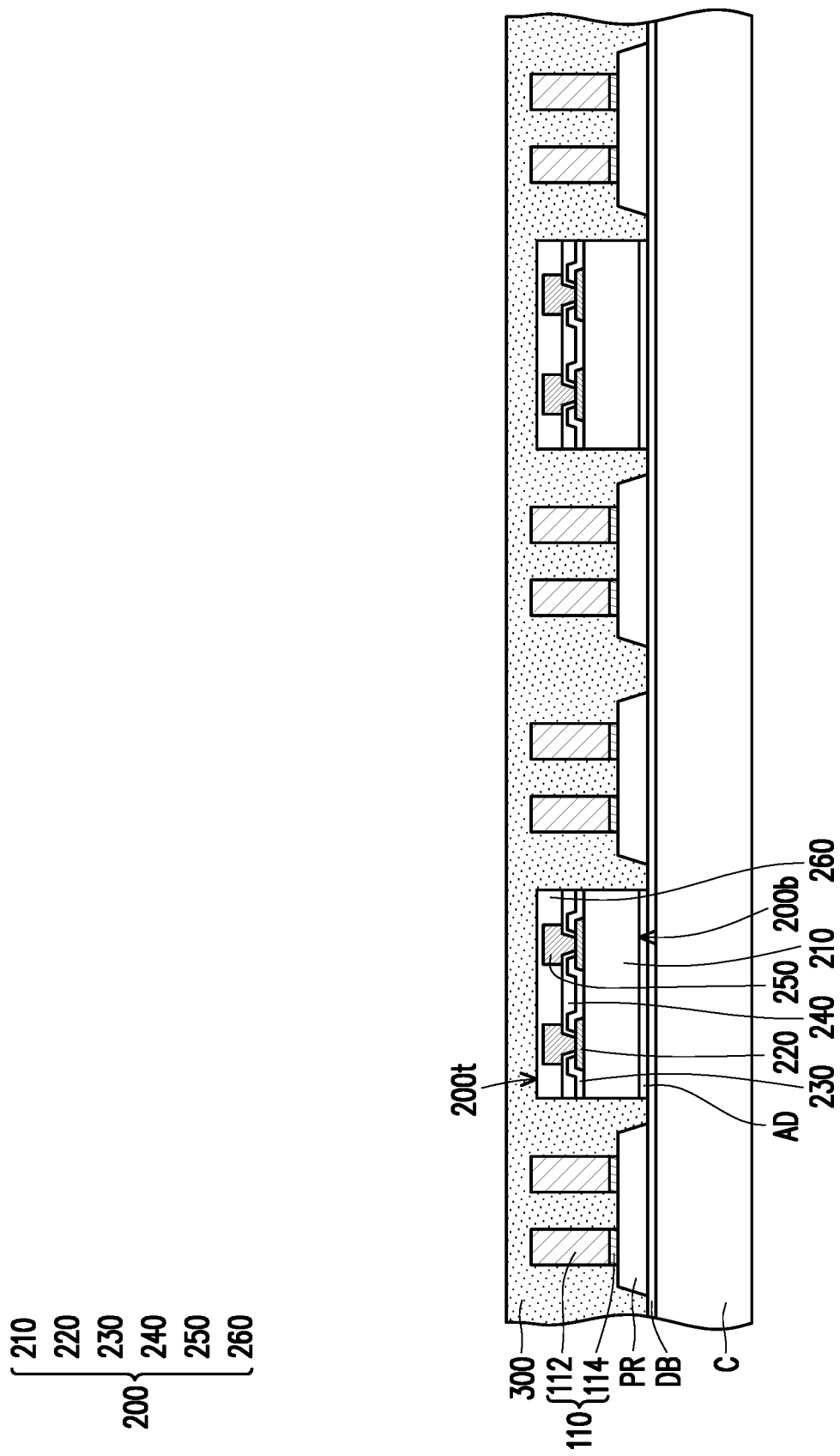

Referring to FIG. 1H, an insulating material 300 is formed on the de-bonding layer DB to cover the semiconductor dies 200, the conductive through vias 110 and the polymer ring patterns PR. In some embodiments, the insulating material 300 is a molding compound, a molding underfill, a resin (such as epoxy resin), or the like. In some embodiments, the insulating material 300 may be formed by a molding process, such as a compression molding process. As shown in FIG. 1H, the protection layers 260 of the semiconductor dies 200 and the conductive through vias 110 are covered by the insulating material 300. In other words, the protection layers 260 of the semiconductor dies 200 and the conductive through vias 110 are not revealed and are well protected by the insulating material 300.

Figure 1I:
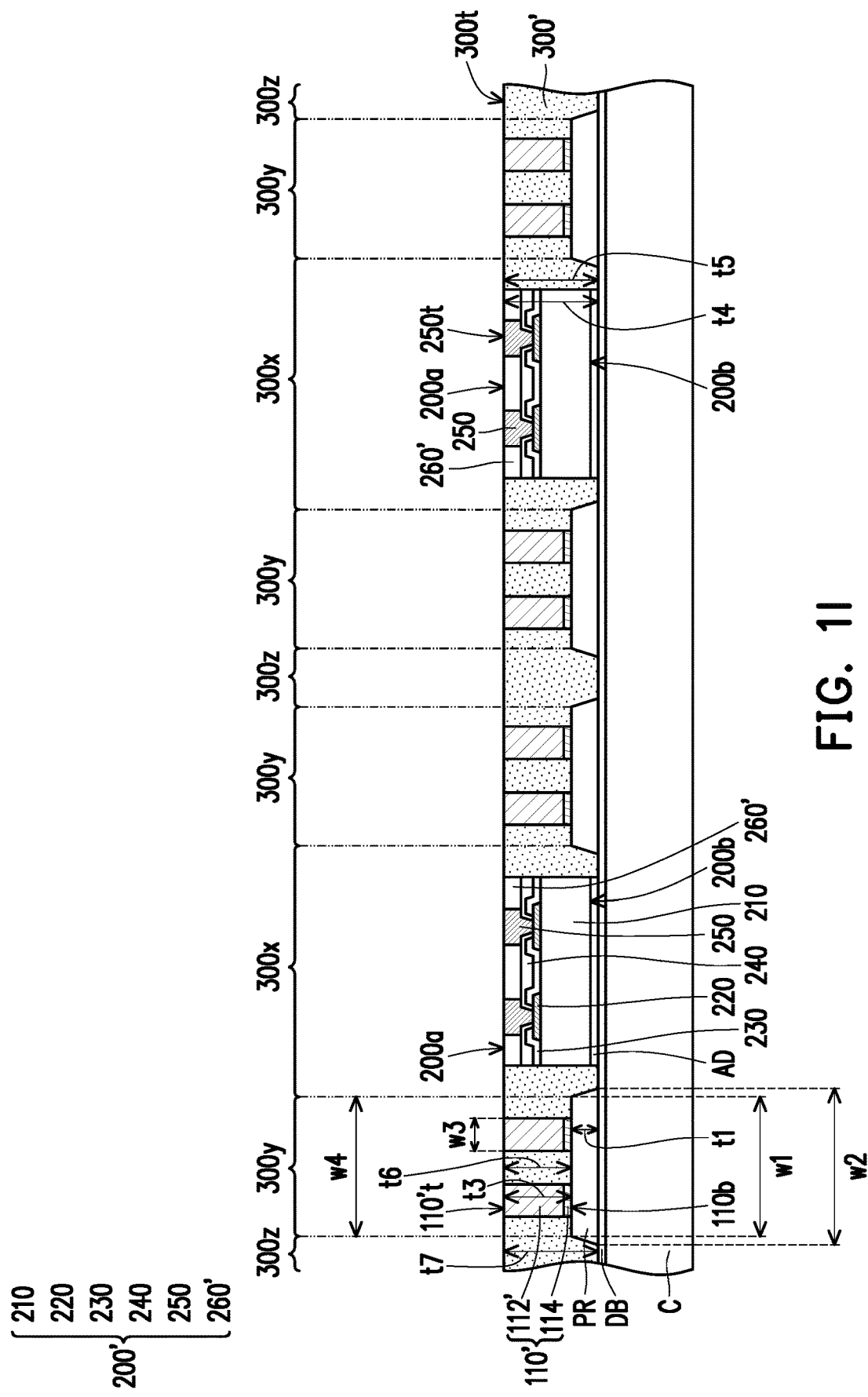

Referring to FIG. 1H and FIG. 1I, the insulating material 300, the semiconductor dies 200 and the conductive patterns 112 are removed through a planarization process to form an insulating encapsulation 300', semiconductor dies 200' and conductive patterns 112' until top surfaces 250t of the conductive pillars 250 are exposed. In some embodiments, the planarization process is performed by performing a mechanical grinding process and/or a chemical mechanical polishing (CMP) process. In some embodiments, the conductive patterns 112' and the seed layer patterns 114 are collectively referred to as conductive through vias 110'. In other words, as illustrated in FIG. 1I, the conductive through vias 110' are formed on the polymer ring patterns PR. After the planarization process is performed, each of the conductive through vias 110' has a top surface 110t' opposite to the bottom surface 110b. In some embodiments, the insulating encapsulation 300' is formed over the de-bonding layer DB and laterally encapsulates the semiconductor dies 200', the conductive through vias 110' and the polymer ring patterns PR. In other words, as illustrated in FIG. 1I, the insulating encapsulation 300' fills the space between the semiconductor dies 200' and the conductive through vias 110', and covers the polymer ring patterns PR. That is to say, the semiconductor dies 200', the conductive through vias 110' and the polymer ring patterns PR are embedded in the insulating encapsulant 300'. During the planarization process, portions of the protection layers 260 of the semiconductor dies 200 above the top surfaces 250t of the conductive pillars 250 are removed to form planarized protection layers 260', thereby the top surfaces 250t of the conductive pillars 250 are exposed in the semiconductor dies 200'. In some embodiments, during the planarization process, portions of the conductive pillars 250 may be slightly removed as well.

After the planarization process is performed, each of the semiconductor dies 200' has an active surface 200a opposite to the bottom surface 200b, and the insulating encapsulation 300' has a top surface 300t and a bottom surface 300b opposite to the top surface 300t. In some embodiments, the top surfaces 250t of the conductive pillars 250 are located on the active surface 200c of the semiconductor die 200'. It is noted that the active surfaces 200a of the semiconductor dies 200', the top surface 300t of the insulating encapsulation 300' and top surfaces 110t of the conductive through vias 110' are substantially coplanar with each other. In some embodiments, the thickness t3 of each of the conductive through vias 110' may range from about 50 micrometers to about 300 micrometers. In some embodiments, a total thickness t4 of the semiconductor die 200' and the adhesive layer AD may range from about 50 micrometers to about 530 micrometers. In some embodiments, the thickness t3 of each of the conductive through vias 110' is less than the total thickness t4 of the semiconductor die 200' and the adhesive layer AD. In some embodiments, a ratio of the thickness t3 of each of the conductive through vias 110' to the total thickness t4 of the semiconductor die 200' and the adhesive layer AD may ranges from about 30% to about 90%, and hence the semiconductor package 60 has great electrical performance.

In some embodiments, the insulating encapsulant 300' has first portions 300x, second portions 300y and a third portion 300z. Referring to FIG. 1I and FIG. 2, the first portions 300x laterally encapsulate the semiconductor dies 200', the second portions 300y laterally encapsulate the conductive through vias 110'. Referring to FIG. 2, from the top view, each of the second portions 300y continuously enclose the corresponding first portion 300x, and the third portion 300z continuously enclose the second portions 300y. In some embodiments, a thickness t5 of each of the first portions 300x is substantially equal to the total thickness t4 of the semiconductor die 200' and the adhesive layer AD. In some embodiments, a thickness t6 of each of the second portions 300y is substantially equal to the thickness t3 of the conductive through via 110'. In some embodiments, a thickness t7 of the third portion 300z is substantially equal to the total thickness t4 of the semiconductor die 200' and the adhesive layer AD.

Figure 3A:
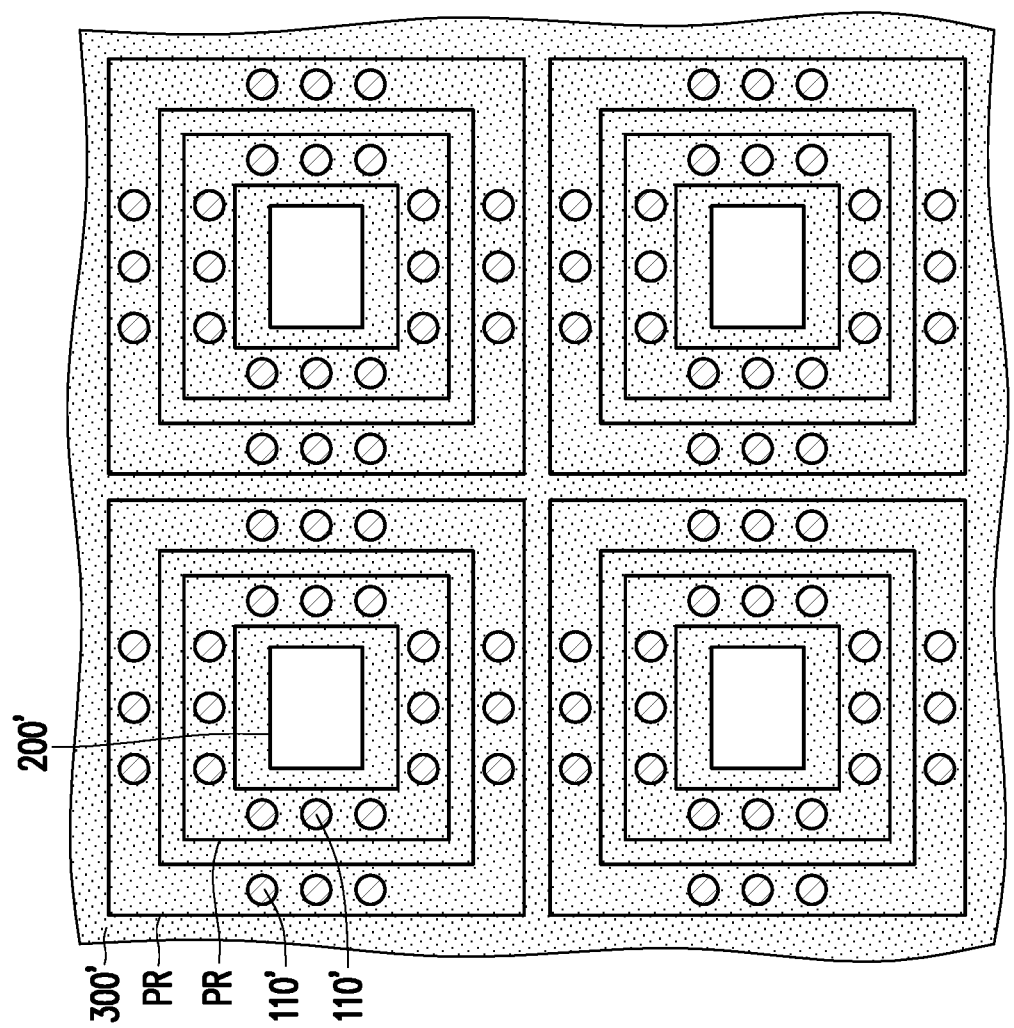
FIG. 3A is a schematic top view illustrating a package structure in accordance with some alternative embodiments of the disclosure.
Figure 3B:
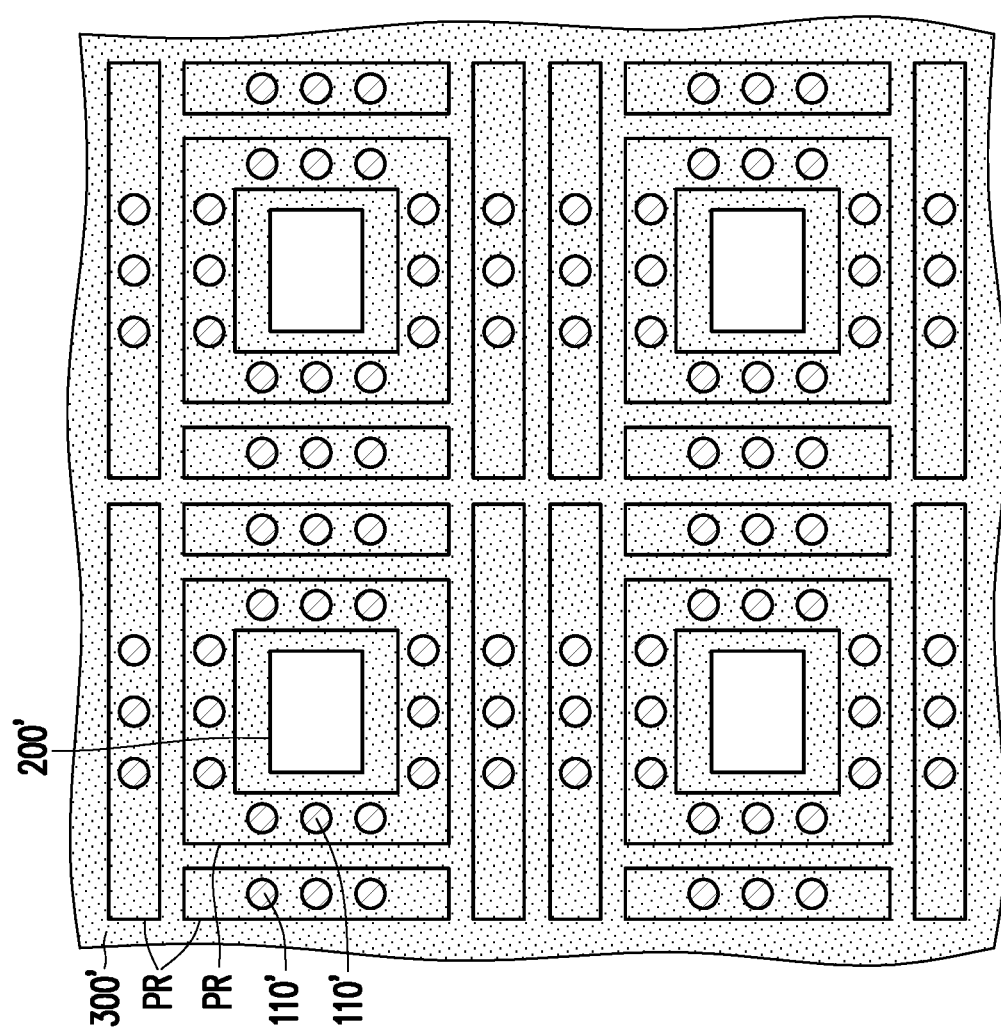
FIG. 3B is a schematic top view illustrating a package structure in accordance with some alternative embodiments of the disclosure.

Referring to FIG. 2, one semiconductor die 200' is surrounded and enclosed by one polymer ring pattern PR. However, the disclosure is not limited thereto. In some alternative embodiments, one semiconductor die 200' is surrounded and enclosed by more than one polymer ring pattern PR. For example, as shown in the FIG. 3A, one semiconductor die 200' is surrounded and enclosed by two polymer ring pattern PR. Besides, referring to FIG. 1I and FIG. 2, the width w1 of the polymer ring pattern PR corresponds to two conductive through vias 110'. However, the disclosure is not limited thereto. In some alternative embodiments, the width w1 of the polymer ring pattern PR corresponds to one conductive through via 110' or more than two conductive through vias 110'. For example, as shown in the FIG. 3A and FIG. 3B, the width w1 of the polymer ring pattern PR corresponds to one conductive through via 110'. Besides, referring to FIG. 2 and FIG. 3A, the polymer ring patterns PR are formed as closed loops. However, the disclosure is not limited thereto. In some alternative embodiments, as shown in the FIG. 3B, the polymer ring patterns PR are formed as closed loops and strip patterns, wherein the strip patterns surround the closed loops.

In some embodiments, a width w3 of each of the conductive through vias 110' is less than the width w1 of the polymer ring pattern PR. However, the disclosure is not limited thereto. In some alternative embodiments, the width w3 of each of the conductive through vias 110' is substantially equal to the width w1 of the polymer ring pattern PR. For example, in the case that the width w1 of the polymer ring pattern PR corresponds to one conductive through via 110', then the width w3 of each of the conductive through vias 110' may substantially equal to the width w1 of the polymer ring pattern PR. Besides, from the top view as shown in FIG. 2, each of the conductive through vias 110' has a circular shape. However, the disclosure is not limited thereto. In some alternative embodiments, each of the conductive through vias 110' may exhibit a polygonal shape from the top view. In the case that the conductive through via 110' has a circular shape from the top view, then the width w3 is the diameter. In some embodiments, a width w4 of each of the second portions 300y is substantially equal to the width w1 of the polymer ring pattern PR.

Figure 1J:
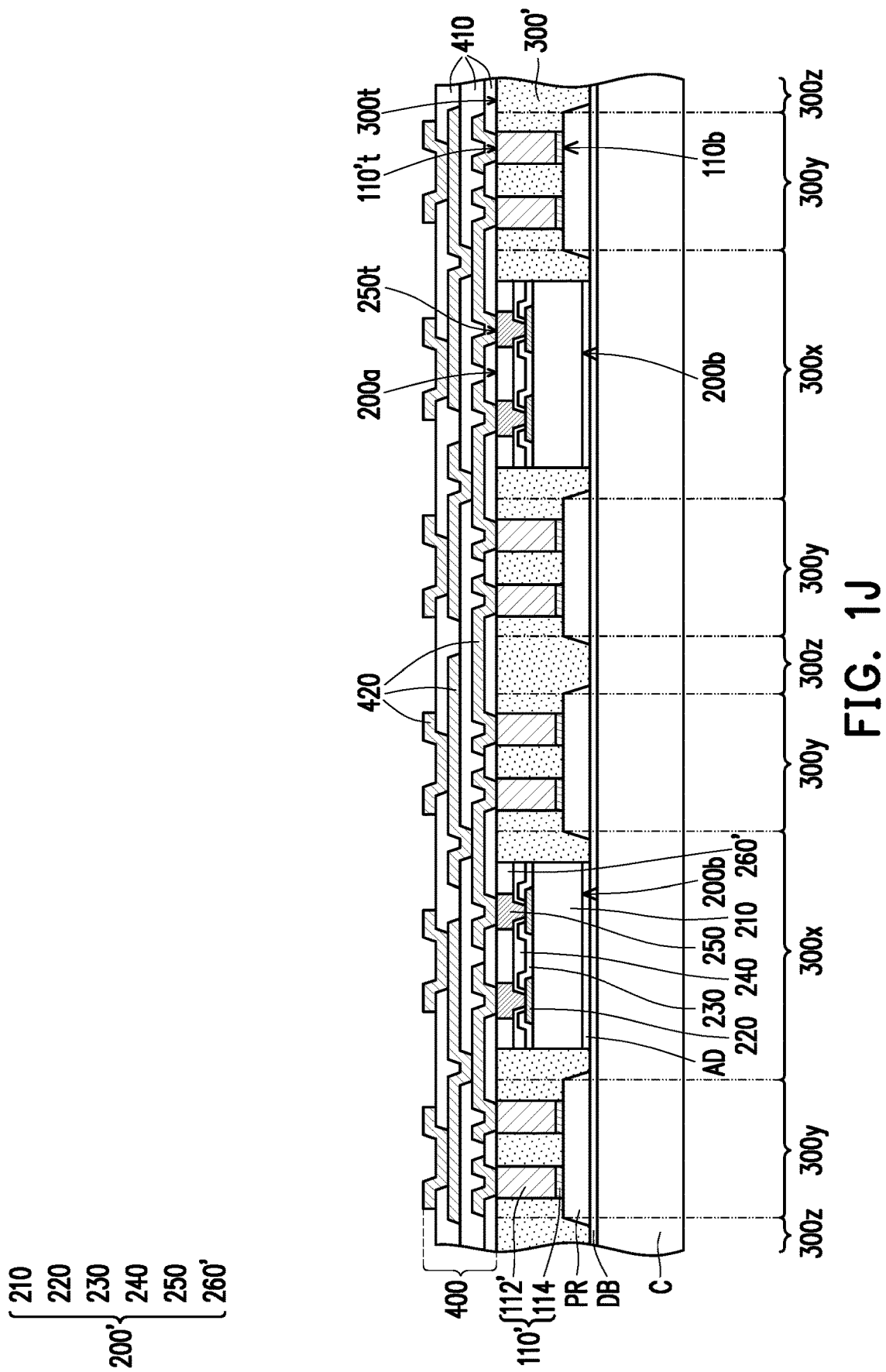

Referring to FIG. 1J, a redistribution structure 400 is formed over the insulating encapsulation 300', the semiconductor dies 200' and the conductive through vias 110'. In some embodiments, the redistribution structure 400 is formed on the top surfaces 110t of the conductive through vias 110', the active surfaces 200a of the semiconductor dies 200', and the top surface 300t of the insulating encapsulation 300' to electrically connect with the conductive through vias 110' and the semiconductor dies 200'. In some embodiments, since the redistribution structure 400 connected to the semiconductor die 200' reroutes the electrical signal of the semiconductor die 200' and expands wider than the size of the semiconductor die 200', the redistribution structure 400 may be referred to as a fan-out redistribution structure.

As illustrated in FIG. 1J, the redistribution structure 400 includes inter-dielectric layers 410 and redistribution conductive layers 420 stacked alternately. The redistribution conductive layers 420 are electrically connected to the conductive pillars 250 of the semiconductor dies 200' and the conductive through vias 110' embedded in the insulating encapsulation 300'. In some embodiments, the bottommost inter-dielectric layer 410 partially covers the top surfaces 250t of the conductive pillars 250 and the top surfaces 110t of the conductive through vias 110' to form a plurality of contact openings. The bottommost redistribution conductive layer 420 extend into the aforementioned contact openings of the bottommost inter-dielectric layer 410 to be in physical contact with the top surfaces 250t of the conductive pillars 250 and the top surfaces 110t of the conductive through vias 110'. As illustrated in FIG. 1J, the topmost redistribution conductive layer 420 include a plurality of pads. In some embodiments, the aforementioned pads may include a plurality of under-ball metallurgy (UBM) patterns for ball mount. In some alternative embodiments, the aforementioned pads may further include a plurality of connection pads for mounting passive components. It is noted that the number of the aforementioned pads is not limited in this disclosure.

In some embodiments, the material of the redistribution conductive layers 420 includes aluminum, titanium, copper, nickel, tungsten, and/or alloys thereof. The redistribution conductive layers 420 may be formed by, for example, electroplating, deposition, and/or photolithography and etching. In some embodiments, the material of the inter-dielectric layers 410 includes polyimide, epoxy resin, acrylic resin, phenol resin, benzocyclobutene (BCB), polybenzo-oxazole (PBO), or other suitable polymer-based dielectric materials. The inter-dielectric layers 410 may be formed by suitable fabrication techniques such as spin-on coating, chemical vapor deposition (CVD), plasma-enhanced chemical vapor deposition (PECVD), or the like.

Figure 1K:
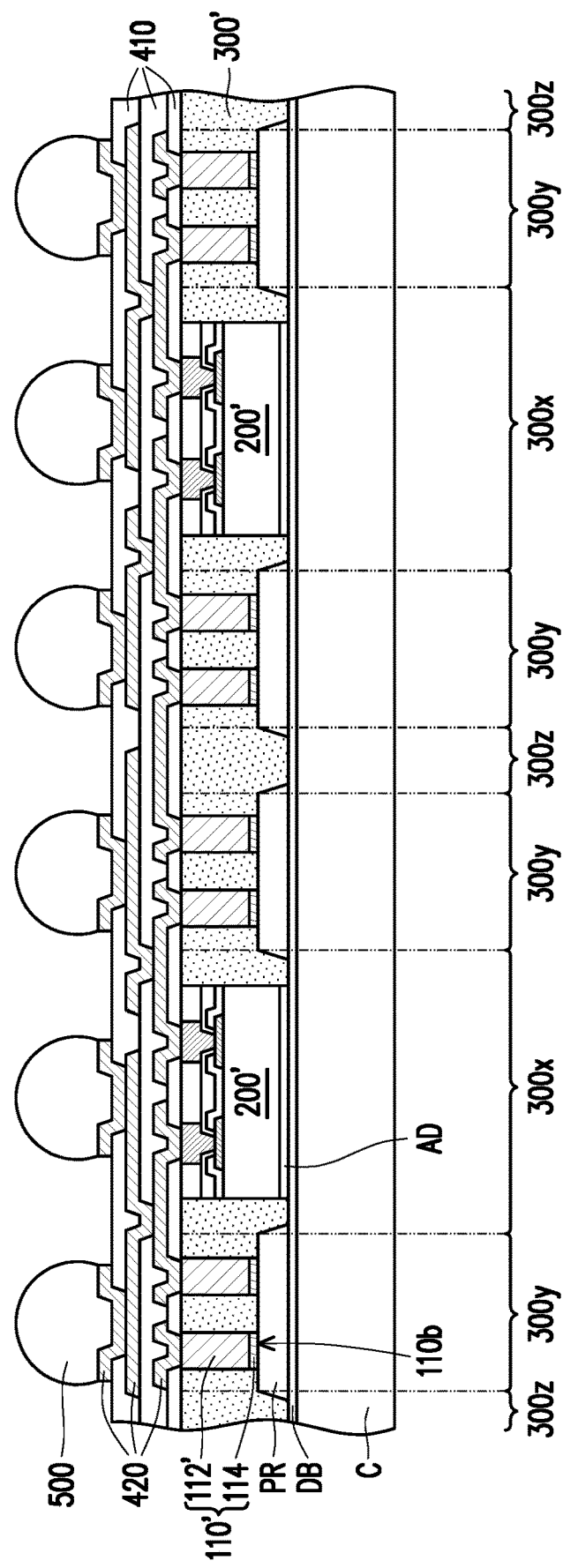

Referring to FIG. 1K, after the redistribution structure 400 is formed, conductive terminals 500 are placed on the topmost redistribution conductive layer 420 (the UBM patterns) of the redistribution structure 400. In some embodiments, the conductive terminals 500 include solder balls. In some embodiments, the conductive terminals 500 may be placed on the UBM patterns through a ball placement process or other suitable processes.

Figure 1L:
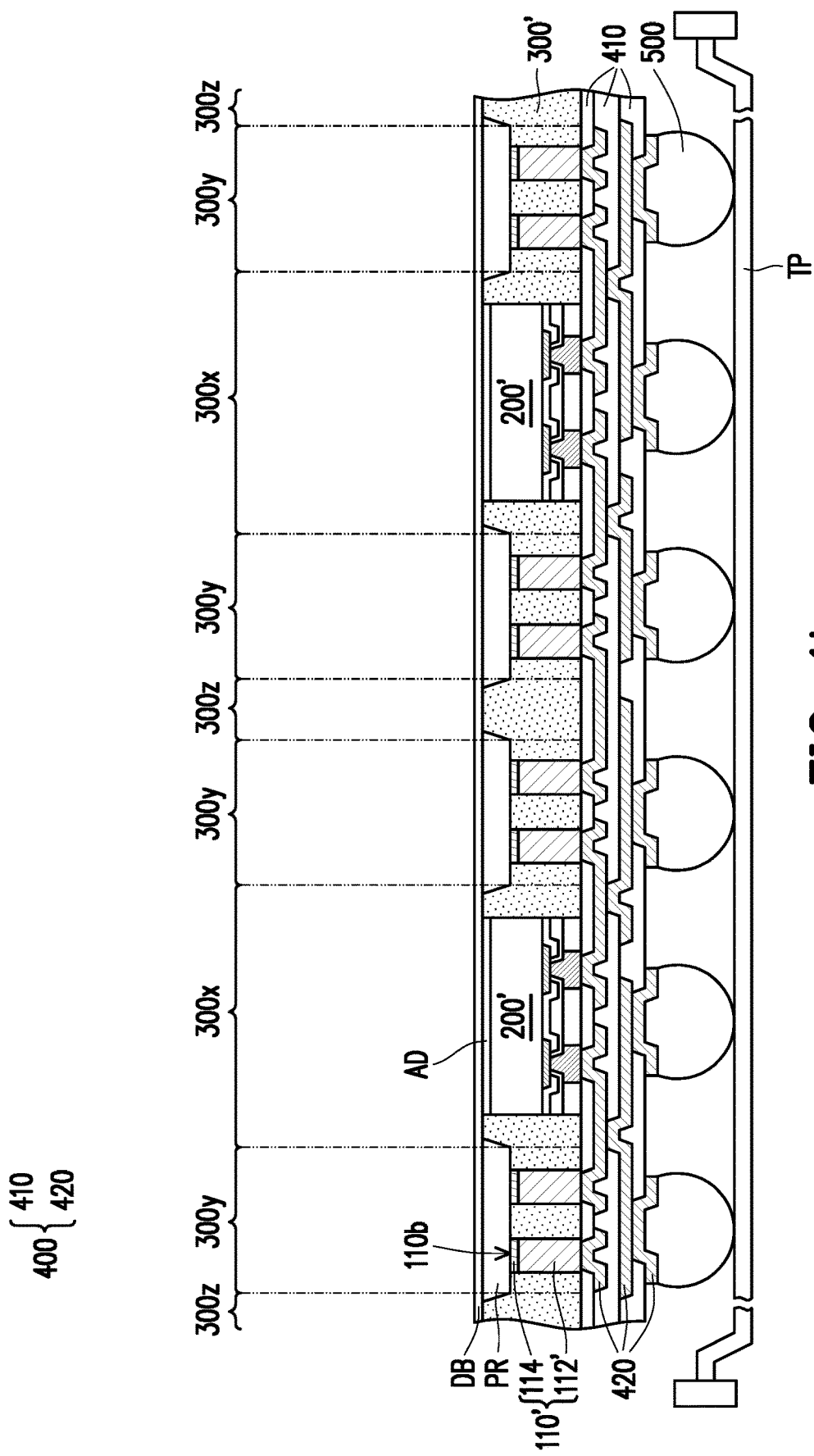

Referring to FIG. 1K and FIG. 1L, after the conductive terminals 500 are formed on the redistribution structure 400, the carrier C is removed. In some embodiments, the removal of the carrier C may be achieved by irradiating the de-bonding layer DB (e.g. the LTHC release layer) with an UV laser such that the carrier C may be peeled off. During the peeling process, a portion of the de-bonding layer DB may stick on the carrier C and may be carried away by the carrier C. Meanwhile, another portion of the de-bonding layer DB remains on the adhesive layer AD, the insulating encapsulation 300', and the conductive through vias 110'. After the carrier C is removed, the structure is flipped upside down such that the bottom surfaces 200b of the semiconductor dies 200' face upward. The flipped structure is placed on a tape TP for further processing, as illustrated in FIG. 1L.

Figure 1M:
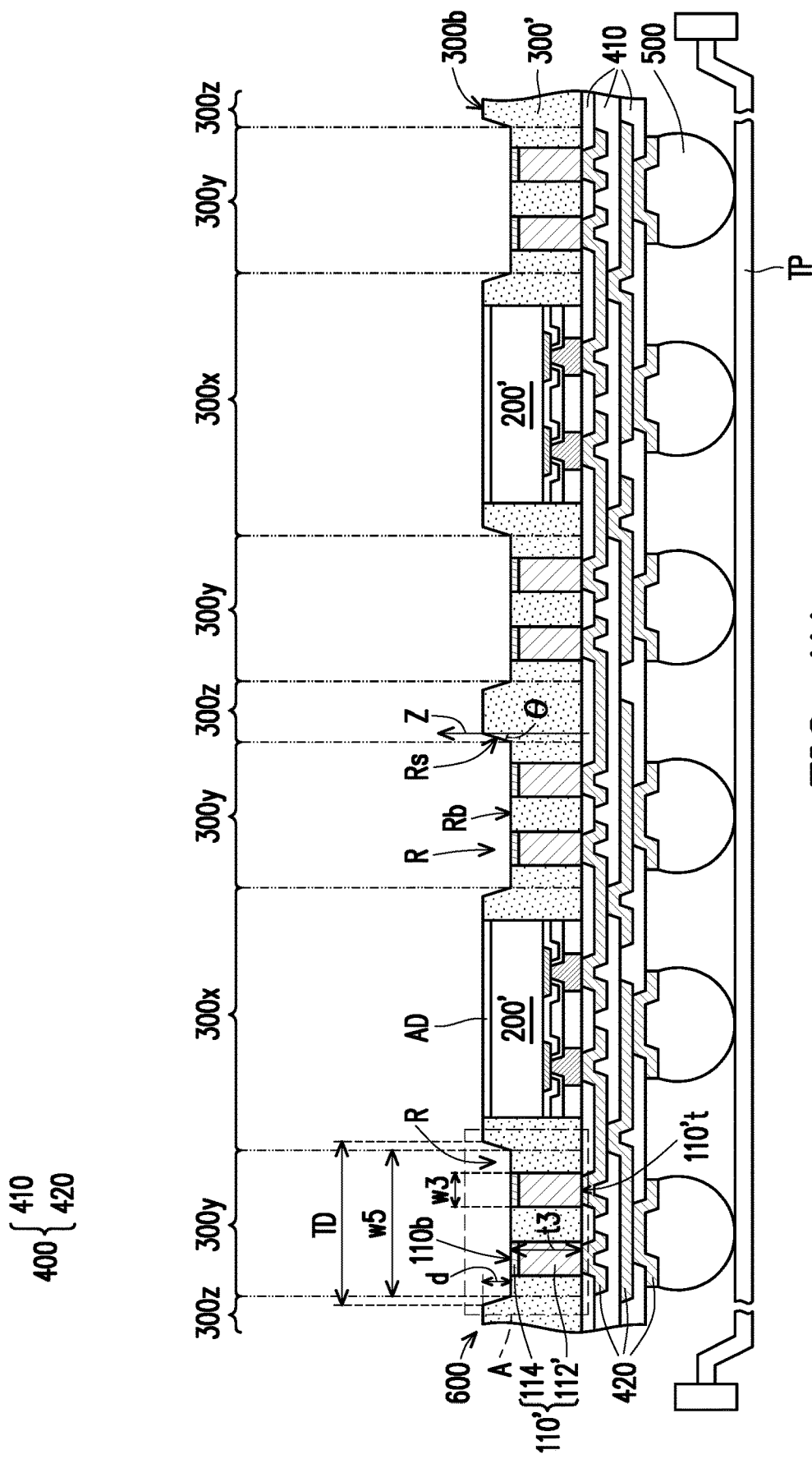

Referring to FIG. 1L and FIG. 1M, the remaining de-bonding layer DB and the polymer ring patterns PR are removed to expose the conductive through vias 110' for future electrical connection. In some embodiments, the remained de-bonding layer DB is removed by performing a dry etching process or a laser drilling process, and the polymer ring patterns PR are removed by performing a dry etching process, a wet etching process or a laser drilling process. In some embodiments, the removal of the remained de-bonding layer DB and the polymer ring patterns PR may be achieved in the same process step. For example, the removal of the remained de-bonding layer DB and the polymer ring patterns PR may be achieved in the same dry etching process step or the same laser drilling process step. However, the disclosure is not limited thereto. In some alternative embodiments, the removal of the remained de-bonding layer DB and the polymer ring patterns PR may be achieved in different process steps. For example, the removal of the remained de-bonding layer DB and the polymer ring patterns PR may be achieved in different dry etching process steps with different conditions or different laser drilling process steps with different conditions. For another example, the removal of the remained de-bonding layer DB may be achieved by a dry etching process or a laser drilling process, and the removal of the polymer ring patterns PR may be achieved by a wet etching process. As illustrated in FIG. 1M, the adhesive layer AD is not removed. However, the disclosure is not limited thereto. In some alternative embodiments, the adhesive layer AD is removed as well to enhance the performance and lifetime of the subsequently formed semiconductor package 60, this is because the adhesive layer AD may have poor thermal conductivity which would lead to accumulation of heat generated during the operation of the semiconductor dies 200' within the semiconductor package 60, thereby compromising the performance and lifetime of the semiconductor package 60.

As illustrated in FIG. 1M, after the polymer ring patterns PR are removed, recess rings R are formed in the insulating encapsulant 300'. Since the recess rings R are formed by removing the polymer ring patterns PR, the recess rings R may have the same contour as the polymer ring patterns PR. In other words, referring back to FIG. 2, from the top view, the shape of each of the recess rings R may be a quadrilateral ring shape. However, the disclosure is not limited thereto. In some alternative embodiments, the shape of each of the recess rings R may be a circle, any other suitable polygon, or any other suitable shape from a top plan view. On the other hand, referring back to FIG. 2, from the top view, each of the recess rings R surrounds the corresponding semiconductor die 200'. As illustrated in FIG. 1M, each of the recess rings R has a bottom surface Rb and side surfaces Rs connected to the bottom surface Rb. In some embodiments, the bottom surface Rb of each of the recess rings R is lower than the bottom surface 300b of the insulating encapsulant 300'. In some embodiments, from the cross-sectional view as shown in FIG. 1M, the width w5 of the bottom surface Rb is less than the top dimension TD of each of the recess rings R. In some embodiments, the width w5 of the bottom surface Rb may range from about 100 micrometers to about 3000 micrometers, and the top dimension TD of each of the recess rings R may range from about 100 micrometers to about 3000 micrometers. In some embodiments, the depth d of each of the recess rings R may range from about 5 micrometers to about 100 micrometers. In some embodiments, each of the side surfaces Rs is tilted with respect to the thickness direction Z of the insulating encapsulant 300'. In other words, as illustrated in FIG. 1M, an included angle $\theta$ is between each of the side surfaces Rs and the thickness direction Z of the insulating encapsulant 300'. In some embodiments, the included angle $\theta$ may range from about 20 degrees to about 85 degrees. In some embodiments, from the cross-sectional view as shown in FIG. 1M, the bottom surface Rb is even surface. However, the disclosure is not limited thereto. In some alternative embodiments, from the cross-sectional view, the bottom surface Rb is a rough surface or an uneven surface, and the roughness of the bottom surface Rb may range from about 1 micrometers to about 30 micrometers. In some embodiments, from the cross-sectional view as shown in FIG. 1M, the edge profile of each of the recess rings R is sharp, but the disclosure is not limited thereto. In some alternative embodiments, from the cross-sectional view, the edge profile of each of the recess rings R is smooth.

Figure 4A:
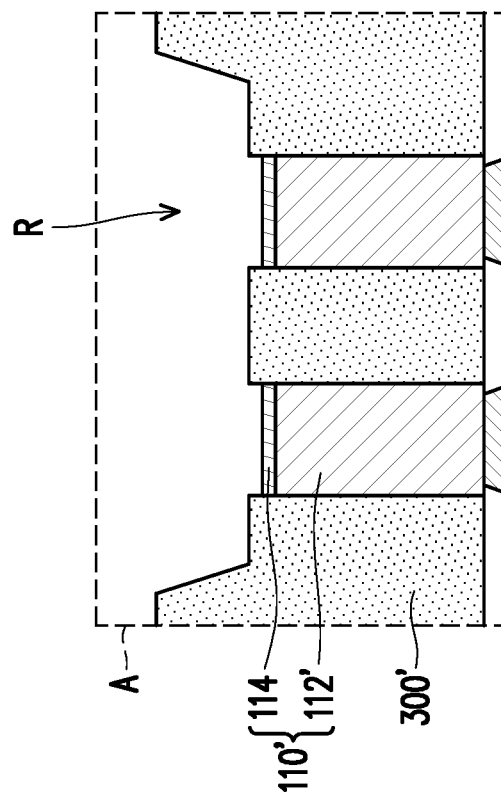
FIG. 4A is an enlarged, schematic cross-sectional view of the dashed box A depicted in FIG. 1M in accordance with some embodiment.
Figure 4B:
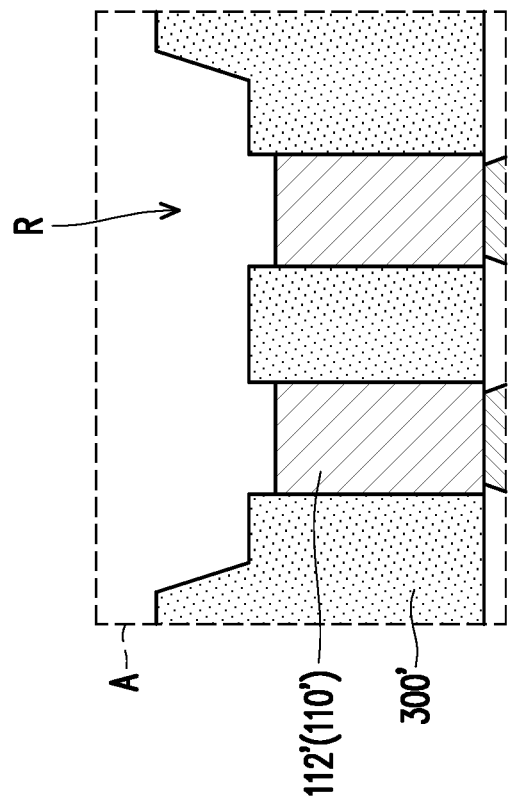
FIG. 4B is an enlarged, schematic cross-sectional view of the dashed box A depicted in FIG. 1M in accordance with some embodiment.

As illustrated in FIG. 1M, after the recess rings R are formed in the insulating encapsulant 300', the seed layer patterns 114 located on the bottom surfaces 110b of the conductive through vias 110' are exposed. In other words, the vertical projection of each of the conductive through vias 110' overlaps with the vertical projection of the recess rings R, and the bottom surfaces 110b of the conductive through vias 110' face the recess rings R. As described above, the bottom surface Rb of each of the recess rings R is lower than the bottom surface 300b of the insulating encapsulant 300', thus the bottom surfaces 110b of the conductive through vias 110' exposed by the recess rings R are lower than the bottom surface 300b of the insulating encapsulant 300'. That is, the bottom surfaces 110b of the conductive through vias 110' for future electrical connection and the bottom surface 300b of the insulating encapsulant 300' are not located at the same horizontal plane. In some embodiments, as illustrated in FIG. 1M, the bottom surface Rb of the recess ring R and the bottom surfaces 110b of the conductive through vias 110' are substantially coplanar with each other. On the other hand, in some embodiments, the seed layer patterns 114 are not removed. However, the disclosure is not limited thereto. In some alternative embodiments, at least a portion of each of the seed layer patterns 114 is removed as well, in order to further enhance adhesion between the conductive through vias 110' and the subsequently formed elements. For example, as shown in the FIG. 4A, a portion of each of the seed layer patterns 114 is removed, wherein each of the seed layer patterns 114 may be a titanium/copper composite layer. For another example, as shown in the FIG. 4B, all the seed layer patterns 114 are removed, wherein the seed layer patterns 114 may be a copper layer. Besides, as shown in FIG. 1M, after the recess rings R are formed in the insulating encapsulant 300', a wafer level semiconductor package 600 having a dual-side terminal design is obtained.

Figure 1N:
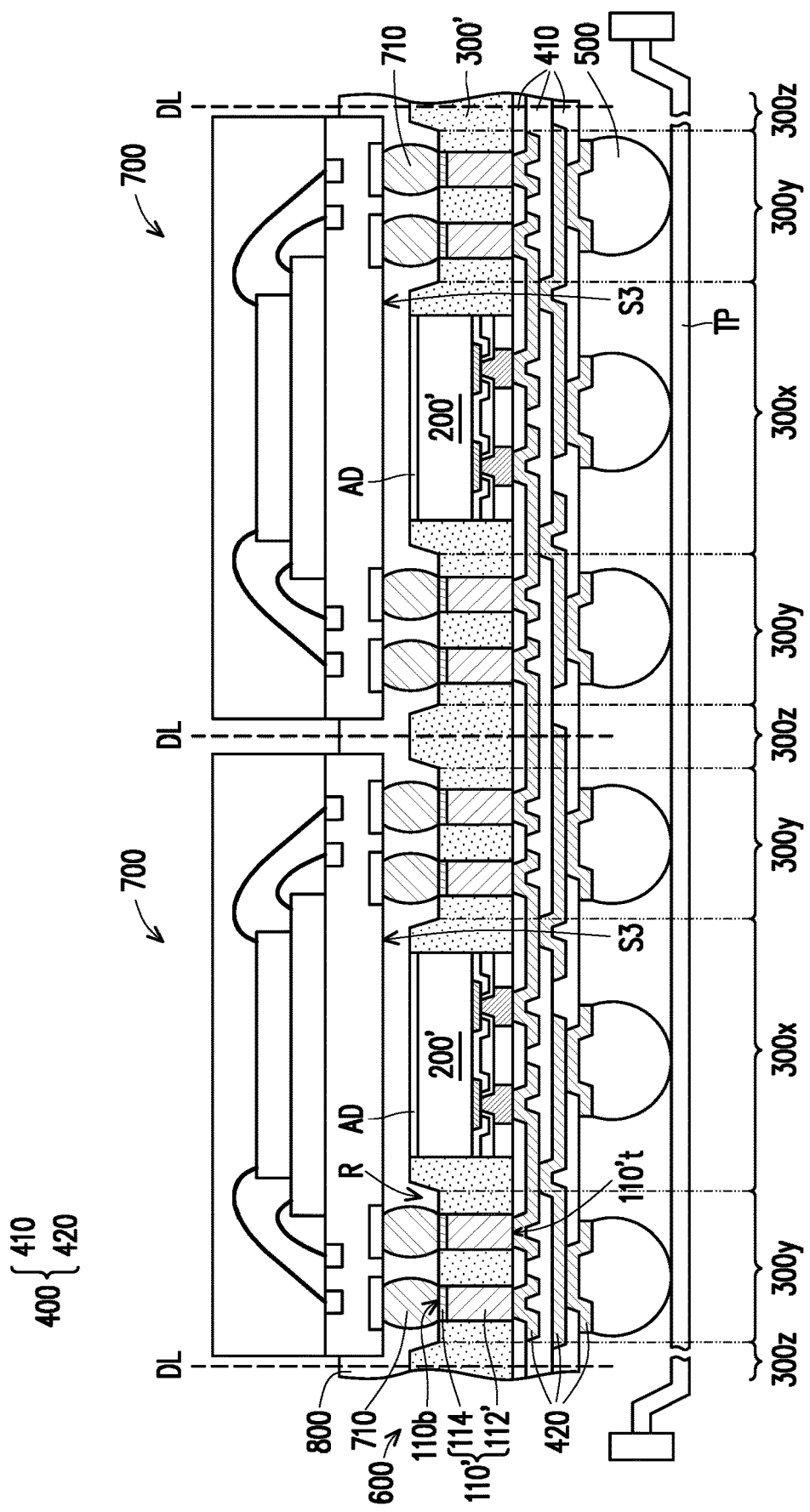
Figure 10:
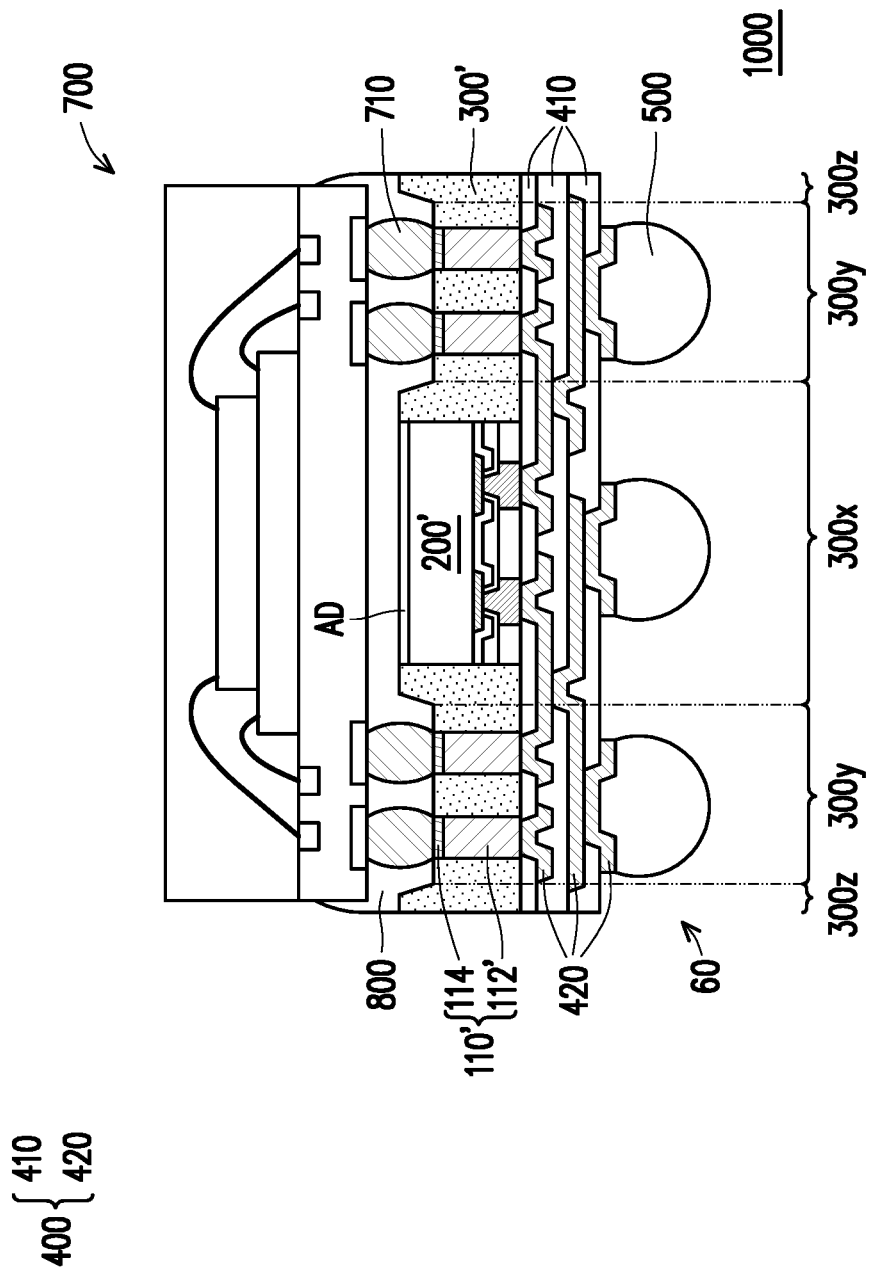

Referring back to FIG. 1N, after the wafer level semiconductor package 600 are formed, semiconductor devices 700 are stacked over the wafer level semiconductor package 600. The semiconductor devices 700 are, for example, IC packages. In some embodiments, each of the semiconductor devices 700 includes connectors 710 formed on a bottom surface S3 thereof. As illustrated in FIG. 1N, the connectors 710 are connected to the bottom surfaces 110b of the conductive through vias 110' such that the semiconductor devices 700 are electrically connected to the wafer level semiconductor package 600 through the connectors 710. For example, the connectors 710 are reflowed to bond with the bottom surfaces 110b of the conductive through vias 110'. Besides, since the bottom surfaces 110b of the conductive through vias 110' are exposed by the recess rings R, the connectors 710 of the semiconductor devices 700 are located within the recess rings R. In some embodiments, the connectors 710 are, for example, lead-free solder balls. It is noted that FIG. 1N merely serves as an exemplary illustration, and the disclosure is not limited thereto. In some alternative embodiments, other electronic devices such as an integrated fan-out (InFO) package, a memory device, a ball grid array (BGA), or a wafer may be stacked over the wafer level semiconductor package 600 in place of the semiconductor devices 700.

Still referring to FIG. 1N, after the electrical bonding of the semiconductor devices 700 and the wafer level semiconductor package 600 is accomplished, an underfill layer 800 is formed between the semiconductor devices 700 and the wafer level semiconductor package 600. In some embodiments, the underfill layer 800 fills the gap between the semiconductor devices 700 and the wafer level semiconductor package 600 such that the underfill layer 800 is disposed inside the recess rings R and directly in contact with the bottom surfaces S3 of the semiconductor devices 700 and the insulating encapsulation 300' of the wafer level semiconductor package 600 to encapsulate the connectors 710 of the semiconductor devices 700. In some embodiments, an underfill material is dispensed or injected between the bottom surfaces S3 of the semiconductor devices 700 and the insulating encapsulant 300' of the wafer level semiconductor package 600. Subsequently, the underfill material may be cured to form the underfill layer 800 filling the recess rings R and encapsulating the connectors 710 of the semiconductor devices 700. The material of the underfill layer 800 and that of the insulating encapsulant 300' may be the same or different and the disclosure is not limited thereto. In some embodiments, the underfill layer 800 may cover the bottom surfaces S3 and also laterally cover a portion of the sidewall of the semiconductor devices 700 for enhancing the reliability of the subsequently formed package structure 1000 (shown in FIG. 1O).

Referring to FIG. 1N and FIG. 1O, a dicing process is performed along the dicing lines DL to cut the wafer level semiconductor package 600 (cutting through the third portion 300z of the insulating encapsulant 300' and redistribution structure 400) to form a plurality of individual and separate package structures 1000. As illustrated in FIG. 1O, each of the package structures 1000 includes an individual semiconductor package 60 formed from cutting the wafer level semiconductor package 600 and the semiconductor device 700 stacked on the semiconductor package 60. Besides, as illustrated in FIG. 1O, the third portion 300z of the insulating encapsulant 300' remains at the edge of each semiconductor package 60, this is because the dicing lines DL extend through the third portion 300z of the insulating encapsulant 300'. In some embodiments, the semiconductor package 60 may be referred to as an InFO package. In some embodiment, the dicing process typically involves dicing with a rotating blade or a laser beam. In other words, the dicing is, for example, a laser cutting process, a mechanical cutting process, or other suitable processes.

Since in the package structure 1000, the connectors 710 of the semiconductor device 700 are connected to the bottom surfaces 110b of the conductive through vias 110' exposed by the recess ring R of the insulating encapsulant 300', the thickness of the package structure 1000 may be reduced. That is, the thickness of the package structure 1000 may be reduced by shortening the gap between the bottom surface S3 of the semiconductor device 700 and the bottom surface 300b of the insulating encapsulant 300' of the semiconductor package 60, thereby meeting the miniaturization requirement.

In accordance with some embodiments of the disclosure, a package structure includes a semiconductor die, conductive through vias, an insulating encapsulant and a redistribution structure. The conductive through vias are electrically coupled to the semiconductor die. The insulating encapsulant laterally encapsulates the semiconductor die and the conductive through vias, wherein the insulating encapsulant has a recess ring surrounding the semiconductor die, the conductive through vias are located under the recess ring, and a vertical projection of each of the conductive through vias overlaps with a vertical projection of the recess ring. The redistribution structure is electrically connected to the semiconductor die and the conductive through vias.

In accordance with some embodiments of the disclosure, a package structure includes a redistribution structure, a semiconductor die, conductive through vias, and an insulating encapsulant. The semiconductor die is disposed on the redistribution structure. The conductive through vias are disposed on the redistribution structure and aside of the semiconductor die, wherein the conductive through vias are electrically coupled to the semiconductor die and the redistribution structure. The insulating encapsulant is disposed on the redistribution structure and has a first portion laterally encapsulating the semiconductor die and a second portion laterally encapsulating the conductive through vias, wherein a thickness of the second portion is less than a thickness of the first portion.

In accordance with some embodiments of the disclosure, a manufacturing method of a package structure is provided. The method includes at least the following steps. A carrier is provided. Polymer ring patterns are formed on the carrier. Conductive through vias are provided on the polymer ring patterns and semiconductor dies are provided beside the polymer ring patterns. The semiconductor dies, the conductive through vias and the polymer ring patterns are laterally encapsulated with an insulating encapsulant. A redistribution structure is formed over the insulating encapsulant, the conductive through vias and the semiconductor dies, wherein the redistribution structure is electrically connected to the conductive through vias and the semiconductor dies. Conductive terminals are disposed on the redistribution structure. The carrier is removed. The polymer ring patterns are removed to expose the conductive through vias.

The foregoing outlines features of several embodiments so that those skilled in the art may better understand the aspects of the disclosure. Those skilled in the art should appreciate that they may readily use the disclosure as a basis for designing or modifying other processes and structures for carrying out the same purposes and/or achieving the same advantages of the embodiments introduced herein. Those skilled in the art should also realize that such equivalent constructions do not depart from the spirit and scope of the disclosure, and that they may make various changes, substitutions, and alterations herein without departing from the spirit and scope of the disclosure.

What is claimed is:

1. A manufacturing method of package structure, comprising:
   forming polymer ring patterns;
   providing conductive through vias on the respective polymer ring patterns and providing semiconductor dies in an area enclosed by the polymer ring patterns;
   laterally encapsulating the semiconductor dies, the conductive through vias and the polymer ring patterns with an insulating encapsulant;
   forming a redistribution structure over the insulating encapsulant, the conductive through vias and the semiconductor dies, wherein the redistribution structure is electrically connected to the conductive through vias and the semiconductor dies;
   disposing conductive terminals on the redistribution structure; and
   removing the polymer ring patterns to expose the conductive through vias.

2. The manufacturing method according to claim 1, wherein forming the polymer ring patterns comprises performing a printing process to form polymer material patterns and performing a curing process to cure the polymer material patterns into the polymer ring patterns surrounding at least one of the semiconductor dies.

3. The manufacturing method according to claim 2, wherein the polymer ring patterns are formed as closed loops.

4. The manufacturing method according to claim 2, wherein the polymer ring patterns are formed as closed loops and strip patterns surrounding the closed loops.

5. The manufacturing method according to claim 1, wherein removing the polymer ring patterns comprises performing a dry etching process, a wet etching process or a laser drilling process.

6. The manufacturing method according to claim 1, further comprising disposing semiconductor devices having respective connectors on the exposed conductive through vias and connecting the semiconductor devices with the semiconductor dies respectively.

7. The manufacturing method according to claim 6, further comprising forming an underfill layer between the semiconductor devices and the insulating encapsulant to encapsulate the connectors of the semiconductor devices.

8. A manufacturing method of package structure, comprising:
   forming polymer ring patterns;
   providing conductive through vias having seed layer patterns on the polymer ring patterns respectively and providing semiconductor dies inside the polymer ring patterns;
   laterally encapsulating the semiconductor dies, the conductive through vias and the polymer ring patterns with an insulating encapsulant, wherein the insulating encapsulant has first portions and second portions, the first portions laterally encapsulate the semiconductor dies, the second portions laterally encapsulate the conductive through vias, a thickness of each of the second portions is substantially equal to a thickness of each of the conductive through vias;
   forming a redistribution structure over the insulating encapsulant, the conductive through vias and the semiconductor dies, wherein the redistribution structure is electrically connected to the conductive through vias and the semiconductor dies;
   disposing conductive terminals on the redistribution structure; and
   removing the polymer ring patterns to expose the seed layer patterns of the conductive through vias.

9. The manufacturing method according to claim 8, wherein forming the polymer ring patterns comprises performing a printing process to form polymer material patterns and performing a baking process to cure the polymer material patterns into the polymer ring patterns surrounding at least one of the semiconductor dies.

10. The manufacturing method according to claim 9, wherein a material of the polymer material patterns includes epoxy resin or acrylic resin.

11. The manufacturing method according to claim 8, wherein the polymer ring patterns are formed as closed loops.

12. The manufacturing method according to claim 8, wherein the polymer ring patterns are formed as closed loops and strip patterns surrounding the closed loops.

13. The manufacturing method according to claim 8, wherein during removing the polymer ring patterns, at least a portion of each of the seed layer patterns of the conductive through vias is removed and exposed.

14. The manufacturing method according to claim 8, further comprising disposing semiconductor devices having respective connectors on the exposed seed layer patterns of the conductive through vias and connecting the semiconductor devices with the semiconductor dies respectively.

15. A manufacturing method of package structure, comprising:
   forming polymer ring patterns;
   providing conductive through vias contacting the respective polymer ring patterns and providing semiconductor dies beside the polymer ring patterns and the conductive through vias;
   laterally encapsulating the semiconductor dies, the conductive through vias and the polymer ring patterns with an insulating encapsulant;
   forming a redistribution structure over the insulating encapsulant, the conductive through vias and the semiconductor dies, wherein the redistribution structure is electrically connected to the conductive through vias and the semiconductor dies;
   disposing conductive terminals on the redistribution structure; and
   removing the polymer ring patterns to form recess rings in the insulating encapsulant exposing the conductive through vias, wherein the insulating encapsulant has first portions and second portions, each of the recess rings is disposed in the corresponding second portion, each of the second portions continuously enclose the corresponding first portion, each of the second portions has a thickness less than a thickness of each of the first portions.

16. The manufacturing method according to claim 15, wherein forming the polymer ring patterns comprises performing a printing process to form polymer material patterns and performing a baking process to cure the polymer material patterns into the polymer ring patterns surrounding at least one of the semiconductor dies.

17. The manufacturing method according to claim 15, wherein removing the polymer ring patterns comprises performing a dry etching process, a wet etching process or a laser drilling process.

18. The manufacturing method according to claim 15, wherein after removing the polymer ring patterns, the exposed conductive through vias are lower than a bottom surface of the recess rings.

19. The manufacturing method according to claim 15, wherein after removing the polymer ring patterns, top surfaces of the exposed conductive through vias are substantially coplanar with a bottom surface of the recess rings.

20. The manufacturing method according to claim 15, further comprising connecting semiconductor devices with the exposed conductive through vias through connectors respectively.

* * * * *